United States Patent [19]

Lampkin

[11] Patent Number: 5,405,517
[45] Date of Patent: Apr. 11, 1995

[54] MAGNETRON SPUTTERING METHOD AND APPARATUS FOR COMPOUND THIN FILMS

[75] Inventor: Curtis M. Lampkin, 710 Venetian Way, Merritt Island, Fla. 32953

[73] Assignee: Curtis M. Lampkin, Merritt Island, Fla.

[21] Appl. No.: 162,592

[22] Filed: Dec. 6, 1993

[51] Int. Cl.6 .......................................... C23C 14/35
[52] U.S. Cl. .................. 204/192.12; 204/192.15; 204/192.25; 204/298.22; 204/298.26; 136/265; 437/5
[58] Field of Search ............. 204/192.12, 192.15, 204/192.25, 192.26, 298.22, 298.26

[56] References Cited

U.S. PATENT DOCUMENTS

| | | | |
|---|---|---|---|
| 4,356,073 | 10/1982 | McKelvey | 204/192.12 |
| 4,422,916 | 12/1983 | McKelvey | 204/192.12 |
| 4,443,318 | 4/1984 | McKelvey | 204/298.23 |
| 4,465,575 | 8/1984 | Love | 204/192.26 |
| 4,466,877 | 8/1984 | McKelvey | 204/298.23 |
| 4,866,032 | 9/1989 | Fujimori et al. | 505/476 |
| 4,902,394 | 2/1990 | Kenmotsu | 204/192.12 |
| 5,096,562 | 3/1992 | Boozenny et al. | 204/298.22 |
| 5,108,574 | 4/1992 | Kirs et al. | 204/298.22 |
| 5,158,660 | 10/1992 | Devigne et al. | 204/298.21 |
| 5,211,824 | 5/1993 | Knapp | 204/192.15 |

OTHER PUBLICATIONS

A. Belkind, "Cosputtering and Serial Cosputtering Using Cylindrical Rotatable Magnetrons", J. Vac. Sci. Technol. A, 11(4) Jul./Aug. 1993, pp. 1501–1509.

*Primary Examiner*—Aaron Weisstuch

[57] ABSTRACT

An apparatus is described for depositing a thin film (9) of compound materials on selected substrates (48) in an evacuable coating chamber. This apparatus includes a rotating primary surrogate magnetron cathode surface (19) which acts to receive, in-situ, material to be sputtered. Vapor crucibles (2) expose the rotating cathode surface (19) to material vapors (8) which condense on the thermally cooled cathode surface (19) to combine with other coatings on the cathode and are thence rotated through the associated plasma sputter zone (26P) to sputter deposit desired film (9). Auxiliary rotating magnetron cathodes (32) can deposit additional material onto rotating primary cathode (19). Molten material crucible assemblies (31) having coating rollers (34) can convey molten material onto rotating auxiliary thermally cooled cathode surfaces (32) which sputter coat primary cathode. When a selected combination of vapor crucibles (2) and auxiliary rotating cathodes (32) cooperate to coat rotating primary cathode surface (19) it is possible to deposit alloys or a large class of compound thin film materials in-situ without having to prefabricate cathodes of compound materials.

Sputter deposited film (9) uniformity is improved by use of three methods: cyclically varying power applied to the primary surrogate cathode, narrow sputter zones, and premixing of condensing vapors.

19 Claims, 3 Drawing Sheets

MAGNETRON SPUTTERING METHOD AND APPARATUS FOR COMPOUND THIN FILMS

BACKGROUND

1. Field of Invention

This invention relates to sputter deposition of thin films in a vacuum, specifically to an improved apparatus for depositing compound thin films.

2. Description of Prior Art

The DC magnetron sputter coating process has proven to be an effective and economical thin film coating process for a variety of films and substrates. There are three major types of DC magnetron.

The first is the round disc or semi conical disc magnetron used for coating semiconductors and computer hard discs.

The second, the planar magnetron is widely used for coating architectural glass.

The third is the rotating cylindrical magnetron. U.S. Pat. No. 4,422,916 To McKelvey (1984) discloses a rotating cylindrical cathode having a continuous surface. Such cathodes have been fabricated of metals and metal alloys and silicon. They have been used to advantage for depositing metals, alloys, oxides, and nitrides. The rotating cylindrical magnetron is the most recent development and has an advantage over the other two types. It can utilize a higher proportion of cathode material.

Magnetron sputtering can deposit most metals and some alloys. Compounds such as oxides and nitrides can be made by reactive sputtering whereby a solid cathode is sputtered in the presence of a gas which will combine chemically with the solid cathode material in a desired manner. Some compound materials can be deposited by sputtering cathodes of the desired compounds.

However, DC magnetron sputtering has definite limitations. It cannot economically deposit many compound thin films, especially semiconductors. Such compounds include those requiring combinations of metals with elements which don't exist as a gas or which can't be converted to a gas without toxic or hazardous properties. Gases such as $H_2S$, $H_2Te$, $H_2Se$, $AsH_3$, and $PH_3$ fall into this category and can be used to reactively sputter such semiconductor materials as CdS, CdTe, ZnTe, CdSe, CuInSe2, GaAs and InP. These materials, to be of use, require accurate control of elemental ratios. In the process of reactive sputtering a phenomenon known as the hysteresis effect interferes with accurate control of elemental ratios since it causes rapid pressure swings of the gas pressures which can produce the desired ratios of elements. The reason for the pressure swings is that the cathode surface, which starts as a pure metal, becomes coated with the same material that one wishes to deposit. Most compound materials sputter at different rates than their precursor materials. Since a sputter rate difference implies a change in reactive gas usage this rate difference causes the pressure swings. Some workers in the field try to compensate for the pressure swings by using larger vacuum pumps which mask the swings but don't eliminate local pressure changes around the cathode. Others use more complicated control schemes which usually control the process globally, but again, this may not prevent local pressure difference. Local pressure differences of reactive gas around the sputter cathode can cause imperfections in the deposited film.

Some compound materials can be made into solid compound planar cathodes at considerable cost but are still not economically sputtered. Most solid compound cathodes possess such low thermal conductivity that they must be sputtered slowly to prevent melting or cracking. Even when RF sputter power is applied it cannot make up for the lack of adequate thermal conductivity. Rf sputtering is difficult to use in large area deposition as the frequency used (13.56 MHz) can cause spontaneous plasmas to ignite in undesired areas of larger coating chambers. RF power supplies are significantly more expensive than DC supplies, which has a negative economic effect. Whether RF or DC is used, many times the desired elemental ratio incorporated in the solid cathode is not preserved in the final film because of different sputtering rates for each element. In such cases smaller but still significant amounts of the above mentioned toxic gases must be added to the sputtering process to remedy deficiencies in the elemental ratios of the deposited films.

In nearly all cases cathode material purity is a constant problem. While not as important for architectural films, extreme purity is essential for semiconductor films. For this reason, the electronics industry usually uses magnetron sputtering usually for metal conductors on semiconductor devices and for the coating of magnetic hard discs for computer memories but not for deposition of semiconductors themselves.

Cathodes of pure metals, while the easiest to make, are not available for all metals. Metals having low melting temperatures, such as Gallium or Indium, cannot be sputtered rapidly for fear of melting the metal, which causes it to drip, ruining the substrate nearby as well as the cathode itself. Materials which react with the atmosphere, such as Phosphorus, obviously cannot be easily made into cathodes.

Alloys are often difficult since during casting they can form large areas of non-uniform metal ratio. The component metals of the alloy sometimes do not sputter at the same rate. Both of these effects produce non-uniformities in the deposited thin film.

Finally, it should be noted that fabrication of cylindrical cathodes is much more difficult than for planar cathodes. Planar cathodes can be cast or pressed into flat plates and then clamped to the cathode apparatus. Unless the material already exists in tubular form such as for Stainless Steel, Copper, Aluminum, Titanium, and Zinc alloys tubing, then cylindrical cathodes must either be plasma sprayed, which is more expensive and produces less pure material or the cylinder must be electroplated, which is an effective method but available only for some metals or the material must be vacuum cast around the cylindrical cathode base, which again works only for a few metals and is not inexpensive.

From the above one can understand why cathodes of compound materials are nearly unobtainable for cylindrical cathodes.

U.S. Pat. Nos. 4,356,073 to McKelvey (1982) and 4,443,318 to McKelvey (1984) attempt to deposit multiple layers of different materials with a rotatable but not continuously rotating cathode comprised of clamped slabs of different materials wherein a slab of a selected material can be brought into position in the plasma coating zone and deposited onto the substrate. By the nature of the apparatus the multiple materials are deposited in an awkward sequential layered fashion and do not possess the desired uniformity. In order to achieve a compound thin film after the deposition process, extensive heating is needed to diffuse the layers together into a continuum and even then, because of poor elemental ratio control and lack of uniformity, the resulting compound thin films possess inferior characteristics.

OBJECTS AND ADVANTAGES

Objects of this invention are:

The economical formation of a larger class than heretofore available of substantially improved quality compound thin films without the use of toxic gases or compound cathodes.

To provide a thin film synthesis process which is more environmentally acceptable with little or no toxic gas usage.

To provide thin films having superior properties resulting from the high deposition energy inherent in sputtering while gaining much of the economic advantage and ease of use of thermal processes.

Improved purity, uniformity, and ease of control of elemental ratios of deposited compound thin films.

The efficient use of materials by preventing their escape in any significant amount into the coating chamber and through its associated pumping system and thence to the outside environment.

Further objects and advantages are to provide a sputtering apparatus which can deposit compound thin films in an environmentally safe, economical, and rapid manner, which provides a simple process which is easily controlled and by virtue of its simplicity eases the training requirement of the associated operating personnel, thus providing a superior coating process with significantly greater safety and environmental acceptability.

Figure 1:
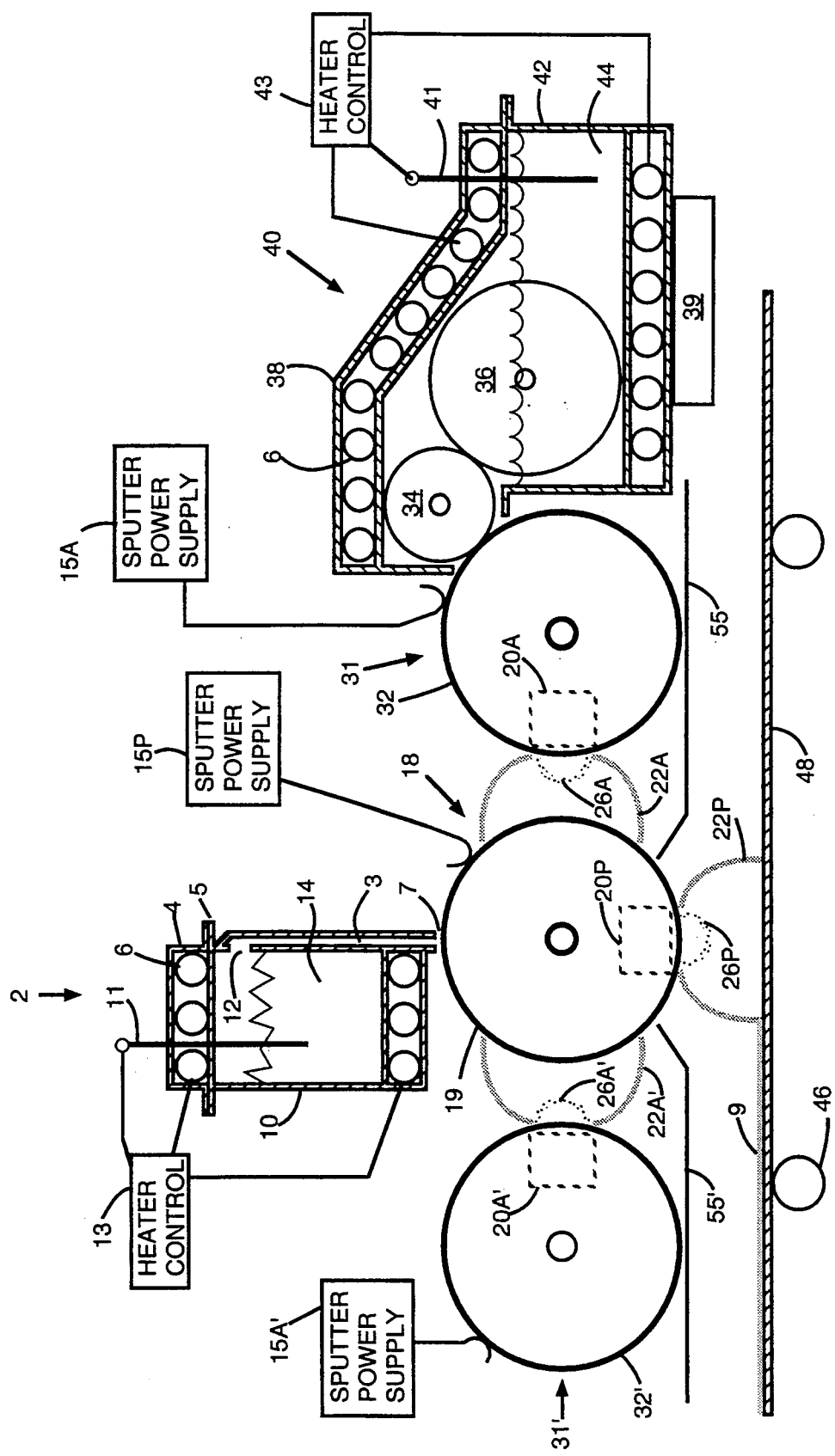
FIG. 1 Side view of apparatus and essential components

| Reference Numerals in drawings | |
|---|---|
| 2 | Vapor Source Assembly |
| 3,3' | Vapor Ducts |
| 4,4' | Lids |
| 5,5' | Joint Seals |
| 6 | Heaters |
| 7 | Gap Between Vapor Duct and Cathode |
| 8,8' | Vapor |
| 9 | Deposited Compound Thin Film |
| 10,10' | Material Container |
| 11,11' | Temperature Sensors |
| 12,12' | Aperture Arrays for Vapor |
| 13,13' | Heater Controllers |
| 14,14' | Material in Vapor Source Container |
| 15A | Sputter Power Supply for Auxiliary Cathode |
| 15P | Sputter Power Supply for Primary Cathode |
| 16 | Plenum |
| 18 | Primary Rotating Sputtering Magnetron |
| 19 | Primary Cathode Surface |
| 20A | Magnetic Assembly for Auxiliary Magnetron |
| 20p | Magnetic Assembly for Primary Magnetron |
| 22A | Sputtered Material Plume from Auxiliary Cathode |
| 22P | Sputtered Material Plume from Primary Cathode |
| 23 | Electron Injection Gun |
| 26A | Auxiliary Plasma Sputter Zone |
| 26P | Primary Plasma Sputter Zone |
| 31,31' | Auxiliary Rotating Magnetron |
| 32,32' | Auxiliary Cathode Surface |
| 34 | Coating Roller |

| -continued | |
|---|---|
| Reference Numerals in drawings | |
| 36 | Pickup Roller |
| 38 | Lid for Crucible |
| 39 | Retracting Mechanism for Crucible |
| 40 | Molten Material Crucible |
| 41 | Temperature Sensor for Crucible |
| 42 | Molten Material Container |
| 43 | Power Supply for Crucible Heaters |
| 44 | Molten Material |
| 46 | Substrate Support Mechanism |
| 48 | Substrate |
| 55,55' | Gas Baffles |

DESCRIPTION OF A PREFERRED EMBODIMENT

Physical Description

Figure 2:
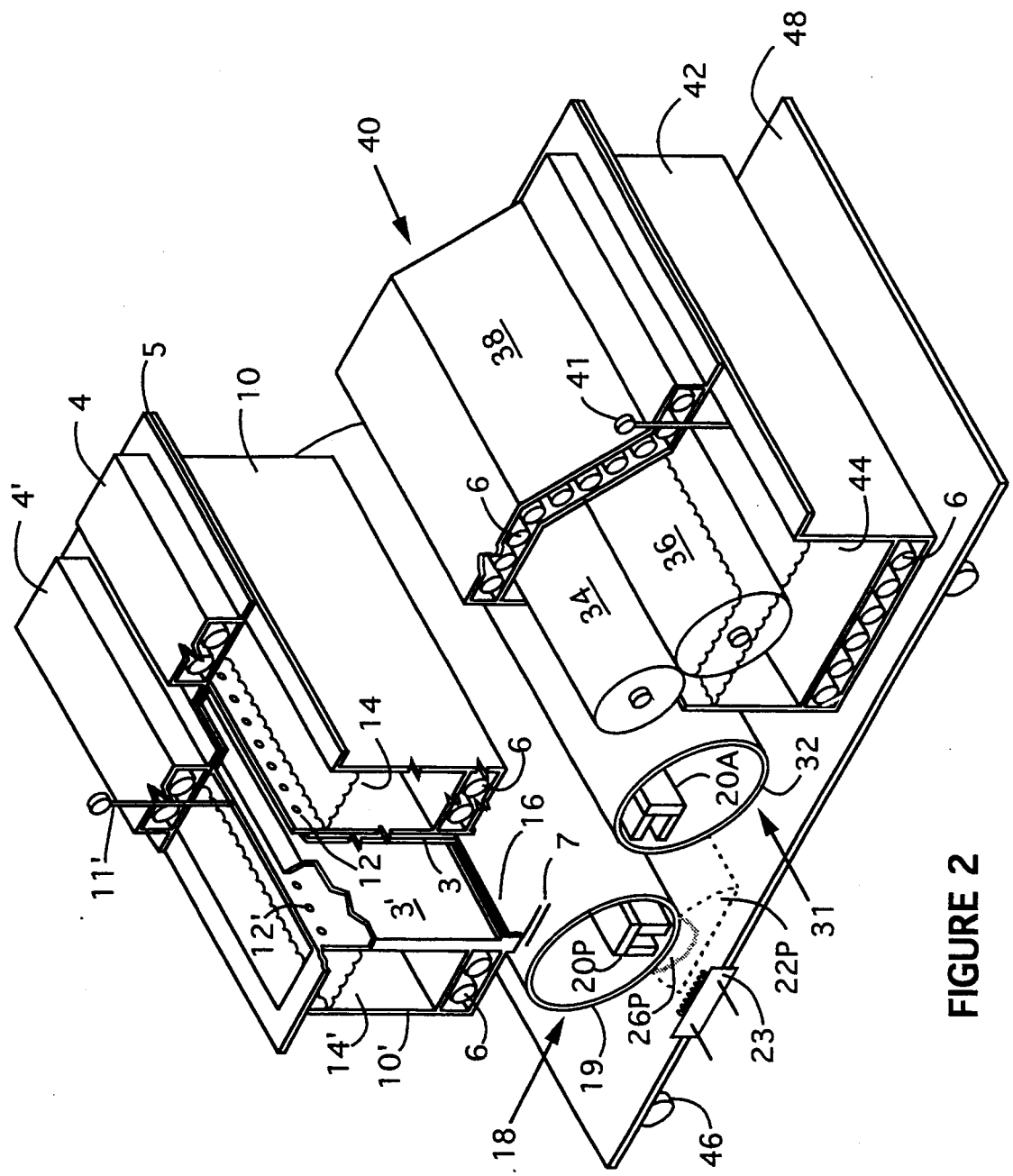
FIG. 2 Perspective view of apparatus and essential components

FIG. 1 shows a side view and FIG. 2 shows a perspective view (altered slightly from FIG. 1) of apparatus suitable for magnetron sputter deposition of a compound thin film 9. Referring now to FIG. 1, we show a thermally cooled primary rotating magnetron surrogate cathode assembly 18 (shown with end removed) having a cathode surface 19 and a magnetic assembly 20P whose position defines a plasma sputter zone 26P. Primary cathode magnetron assembly 18 is mounted by mechanical supports (not shown) in an evacuable coating chamber which has the usual pumping system, valves, and controls (not shown). Adjacent to primary cathode surface 19 is a vapor source 2 (shown in cross section) positioned so as to define a gap 7 between source 2 and primary cathode surface 19. In this drawing, vapor source 2 has one material container 10 filled with material 14. Vapor duct 3 is positioned closely adjacent and parallel to primary cathode surface 19. Aperture array 12 connects duct 3 to material container 10. Material container 10 and source lid contain heaters 6. Temperature sensor 11 is thermally connected to material 14 and is electronically connected to heater controller 13.

Vapor source 2 is fabricated of material suitable to contain material 14 at desired elevated temperatures. Radiation shields (not shown) suitable to lessen heat loss can be attached to the outer surfaces of vapor source 2 if desired. Lid 4 is attached to container 10 by mechanical fasteners (not shown) to form vapor seal 5.

A power supply 15P electrically contacts and supplies electrical power to primary cathode assembly 18.

A thermally cooled auxiliary rotating magnetron surrogate cathode assembly 31 is positioned adjacent primary cathode assembly 18. Auxiliary magnetron assembly 31 has a cathode surface 32 and a magnetic assembly 20A to confine a plasma sputter zone 26A.

A power supply 15A electrically contacts and supplies electrical power to auxiliary cathode assembly 31. Auxiliary cathode assembly 31 is positioned so as to direct a sputtered material plume 22A onto primary cathode surface 19.

A molten material crucible assembly 40 (shown with the end wall removed) is supported by retracting mechanism 39. Crucible assembly 40 is positioned adjacent and parallel to auxiliary cathode surface 32. A coating roller 34 contacts auxiliary cathode 32 and is rotated by a rotary mechanism (not shown) in a manner synchronous to cathode 32's rotary motion. A pickup roller 36 is immersed in a molten material 44 and contacts coating roller 34 and is rotated by a rotary mechanism (not shown) in a manner synchronous to roller 34's rotary motion. A temperature sensor 41 is thermally connected to molten material 44 and electronically connected to a heater controller 43. A lid 38 rests atop a molten material container 42. Lid 38 and container 42 contain heaters 6 which are controlled by heater controller 43.

Another auxiliary magnetron 31' is positioned on the other side of primary magnetron 18. Auxiliary cathode surface 32' can be precoated externally prior to insertion in the evacuable coating chamber with a selected material.

Substrate 48 is advantageously positioned to primary cathode assembly 19 by a support 46.

Operational Description

Example #1

Deposition of a Binary Compound . . . CdTe Using Vapor Source 2 and a Primary Surrogate Magnetron 18

FIG. 1 (side view) shows a configuration containing all mechanisms essential to this invention. In actual use some mechanisms might be omitted while others would be duplicated. For example, to deposit the material CdTe, we need only two vapor sources 2 and one primary cathode assembly 18. This is shown in FIG. 3.

Figure 3:
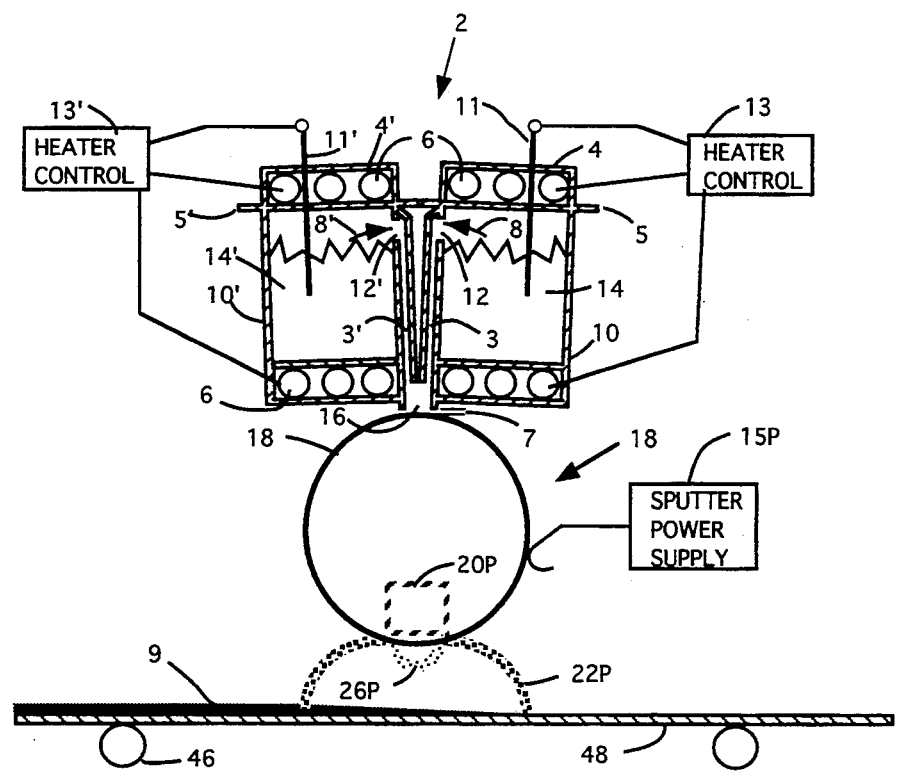
FIG. 3 Apparatus configuration to deposit $CuInSe_2$

Referring to FIG. 3, to deposit CdTe, container 10 is filled with Cd in a convenient form (a powder or a mossy form or granules) while container 10' is filled with Te in a convenient form. Upon heating, these elements will generate vapors having a working pressure in the range of approximately $10^{-7}$ to 1 torr depending on the desired thickness of compound thin film 9. Each container 10 and 10' is separately heated to selected temperatures and pressures to give the ratio of Cd to Te desired in the final product compound thin film 9. Cd vapor 8 and Te vapor 8' enter ducts 3 and 3' through arrays of apertures 12 and 12' and are guided by ducts 3 and 3' to plenum 16 where they are allowed to diffuse and mix together. The mixture of vapors 8 and 8' then condenses from plenum 16 in a continuous uniform film upon cathode surface 19 which is then rotated to sputter plasma zone 26P which sputter deposits CdTe film 9 onto substrate 48.

Gap 7 is set to the minimum dimension consistent with the accuracy of rotation of the cathode surface 18. Gap 7 serves to confine the vapors to the plenum area 16 and minimize their escape to other parts of the coating chamber. Surrogate cathode 19 rotates and carries the condensed Cd and Te into sputter plasma zone 26P. The Cd and Te are sputter deposited onto substrate 48 with deposition energy characteristic of sputtering and deposit a film 9 of CdTe with very uniform composition The vapor feed rate is set so as to coat cathode surface 19 with a condensed material thickness greater than that removed in a single rotation. In this example, the surrogate cathode surface 19 itself is not sputtered and does not contribute material directly to the coating process.

Example #2

Deposition of a Ternary Compound . . . CuInSe$_2$ Using a Vapor Source 2, a Primary Cathode Assembly 18, Auxiliary Cathode Assembly 31', a Copper Pre-coated Cathode Surface 32', Auxiliary Cathode 31, and a Molten Crucible Assembly 40.

The compound semiconductor CuIn Se$_2$ can be made using the apparatus shown in FIG. 1. Selenium in a convenient form is loaded into container 10 of vapor source 2. The temperature of selenium 14 is controlled by sensor 11 and heat controller 13 to achieve a vapor pressure suitable to condense a sufficiently thick film of Selenium on cathode surface 19 of primary rotating magnetron cathode assembly 18.

Cathode surface 32' of Auxiliary rotating magnetron cathode assembly 31' has been pre-coated, external to the coating chamber, with a substantially thick layer of pure copper. While in the coating chamber, Copper coated auxiliary cathode 32' sputter deposits a layer of copper onto primary cathode 19. Primary cathode 19 is also coated with a layer of condensed selenium by vapor source 2. Primary cathode 19 is also sputter coated with a thin layer of Indium sputtered from auxiliary cathode 32. Auxiliary cathode 32 is coated with molten Indium by a molten crucible assembly 40. Indium is selected for this crucible because it has a low melting point and a low vapor pressure. Such a combination of properties makes the molten material crucible 40 more suitable, in this particular instance, for Indium than vapor source 2. Cathode 32 is coated with Indium by means of coating roller 34 which is heated to a temperature above the melting point of Indium. As the molten Indium touches the cooler auxiliary cathode surface 32 it freezes and adheres. Coating roller 34 is in turn coated by pickup roller 36 which drags molten Indium 44 from container 42 while rotating in synchronism with roller 34 and cathode 32.

Once auxiliary cathode 32 is Indium coated to a thickness sufficient for a desired time period of operation, then crucible assembly 40 is retracted from cathode 32 by retracting mechanism 39. Auxiliary cathode 32 then sputter coats Indium onto primary cathode 19. As the Indium coating is spent, a point is reached where the film deposition process is stopped and crucible assembly 40 is re-applied to cathode surface 32. Additional Indium is applied, the crucible assembly 40 is again withdrawn and the sputter deposition proceeds. The amount of Indium coating sputtered onto primary cathode surface 18 is controlled by power supply 15A.

This apparatus produces a 3 layer coating on primary cathode 19. If cathode 19 rotates clockwise as seen in FIG. 1, then Copper is on top, Indium is in the middle and Selenium is at the bottom. Such a coating on cathode 19 will produce a deposited film 9 which is Selenium rich on substrate 48 as it enters sputter plume 22P, Indium rich as the substrate is at the center of sputter plume 22P and Copper rich as the substrate leaves sputter plume 22P. It is obvious that such a layered film 9 is not uniform and will require substantial heat treatment in order to achieve even minimally acceptable properties.

Figure 4:
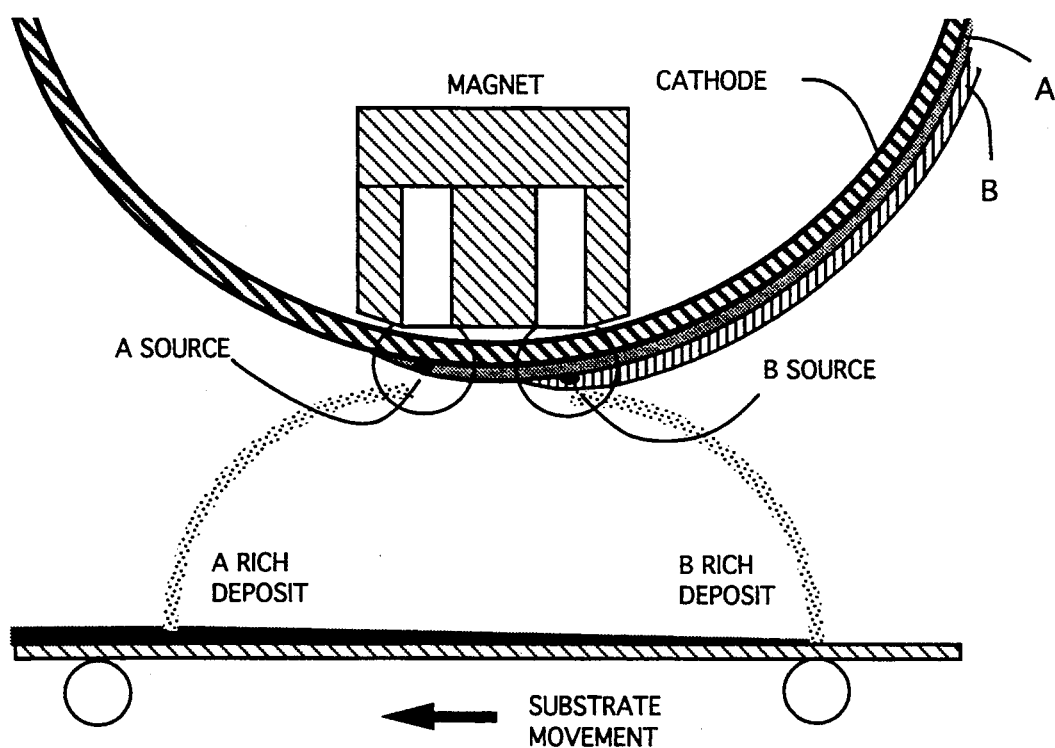
FIG. 4 Geometrical aspects affecting film uniformity

FIG. 4 shows the geometric essentials applicable to this phenomenon for a simpler two layer film of materials A and B. The main idea here is that the each layer seems to come from a different location of the cathode surface. The closer a "source" is to an area of the substrate the richer in that source's material the deposited film will be at that point.

There are several methods which can be used with a rotating surrogate primary cathode to avoid the non-uniformity produced by the layering phenomenon in deposited film 9 described above.

As shown in FIG. 4, the material layer on top will always appear as a "source" of that material on the right hand side of sputter zone 26P. Similarly, the other layer will appear as a source on the left in FIG. 4. One method to reduce the non-uniformity produced by a layered precursor coating on primary cathode 19 is to apply a cyclic variation in power to primary cathode 19. The variation should have an equivalent sinusoidal amplitude of slightly less than twice the average power. This will cause the relative positions of the layers to change as they rotate into the sputter zone. Assuming that a reservoir of several layers has been previously coated onto cathode 18, such cyclical power will not sputter the surrogate cathode surface 18 itself.

As different layers become exposed it then causes the relative positions of all "sources" to exchange places several times while a particular point of substrate 48 is in sputtered material plume 22P.

The cyclic power method works as follows: power variation equates to material removal rate in sputter plasma zone 26P. When layer B is on top a B "source" exists at the first part (right side) of the sputter zone and an A source is on the left. This is seen in FIG. 4. As power increases material is sputtered away faster than the growth rate of the coating deposited by vapor source 2. The B layer is removed faster than it is deposited and now the A layer is exposed further toward the start of the sputter zone. Now an A source exists on the right side along with a B "source". As power is cyclically decreased to the cathode the sputter rate becomes slower than the growth rate of the AB coating. The B layer then becomes thicker and the "B" source returns to its original position. In this way we see the positions of the exposed layers cyclically interchange.

The net effect of this cyclical power application is to distribute the layering effect among several sublayers in film 9. This can improve the uniformity in film 9 by a factor equal to the number of sublayers produced. This improvement can be a factor of 10 or more. Depending on the geometry of sputter zone 26P a suitable waveform type of cyclic power can be selected. Many waveforms including rectangular waves, sine waves, and triangular waves may be considered for this application.

The cyclic frequency will be related by a factor F to the rotation rate of primary rotating cathode surface 18. The factor F will be approximately the ratio of the rotating cathode circumference to the width of the sputter zone track. For instance, if cathode 19's circumference is 40 cm. and sputter plasma zone 26P is formed as an oval 5 cm wide with a 0.7 cm track width, then one value of the cyclic frequency factor F will be approximately $40/0.7 = 55$. Another value of F will be $40/5 = 8$. So, if primary magnetron 18 is rotating at 1 revolution per second, then the cyclic frequency will be approximatly 8 to 55 Hz. The factor F is an aid to visualization. The actual cyclic frequency of power amplitude modulation may vary considerably depending on the particular configuration of the system.

FIG. 4 also shows that the narrower sputter zone 26P can be made then the smaller the separation between "sources". This will cause a more uniform film 9 to be deposited. In the case of a magnetron supported discharge, a single open magnetic circuit will form a single open plasma tube sputtering zone. Such an open plasma tube is a desirable narrow sputter source. However, an open plasma tube cannot trap electrons as effectively as can the wider closed oval race track usually used. The result of less electron trapping is a narrower operating range of pressure and power. To enlarge the operating range it is common to thermionically support the plasma with extra electrons injected from a hot electron emitting filament. The usual practice is to inject electrons directly at the plasma zone on a line perpendicular to the plasma. This usual practise causes the hot electron injecting filament and any associated electron extraction and focusing electrodes to be coated with the material being sputtered.

However, there is a way to avoid such coating of the electron injector. If primary plasma sputter zone 26P is an open single tube of plasma, then by injecting electrons at one end of primary plasma zone 26P with electron gun 23, the electrons will become temporarily trapped and contribute to the plasma until they exit the other end of the plasma tube. Electrons can be injected into only one particular end of the plasma tube, the direction being determined by the orientation of the magnetic field at the cathode surface.

Thus we have three ways to overcome factors contributing to non-uniformity of the deposited film 9. First, as shown in FIG. 3, using a plenum 16 for vapor premixing we can condense material vapors 8 and 8' onto primary cathode surface 19 in a uniform mixed coating. Second, we can use an alternating power cycle applied to primary rotating magnetron 18. Thirdly, we can use an open narrow plasma sputter zone 26P which may require use of electron gun 23 for thermionic support of plasma zone 26P.

SUMMARY, RAMIFICATIONS AND SCOPE

The reader will see that the surrogate cathode provides a convenient apparatus for the deposition of compound thin films. It allows the combined use of mechanically convenient auxiliary coating methods such as thermal vapor sources, molten material rollers and precoated auxiliary cathodes. The purity provided by such application methods in-situ is greatly improved. This is because of the ready availability of pure materials in powder or granular form and the lack of atmospheric contamination.

These thermal methods such as molten materials and vapor sources, while convenient, in themselves have insufficient energy to produce a superior film in many instances. However, when added to the magnetron sputtering process, the combination of such methods and apparatus possesses significantly greater utility than any of the processes and apparatus separately. This invention can provide economical synthesis of compound materials which heretofore have been uneconomical.

We have also shown three methods to improve film uniformity resulting from the use of a surrogate rotating magnetron sputtering cathode.

Although the description above contains specificities, these should not be construed as limiting the scope of the invention but as merely providing illustrations of some of the presently preferred embodiments. For example, rotating discs cathodes or metal rotating belt cathodes supported on cylindrical rollers might be used in some cases in place of the rotating cylindrical magnetron surface. The important aspect is that the magnetron cathode surface rotate in a cyclic manner, wherein any point on the cathode surface repeatedly passes through plasma sputter zone 26P.

Finally, some other aspects of this invention require comment.

First, instead of depositing large amounts of material, vapor source 2 can be used to deposit parts per million or parts per billion amounts of material suitable for doping semiconductor films. This is possible because of the very wide dynamic range of vapor pressures achievable in vapor source 2 by means of temperature control. For instance, if it were desired to use Indium to dope another semiconductor film with part per million (PPM) amounts of indium vapor source then source 2 would be suitable since a low vapor pressure would be convenient.

Second, molten material crucibles and vapor sources can be filled with materials which yield a gas and a solid when such material condenses upon a surrogate cathode or when such condensed material enters the sputtering zone. In such a situation, baffles 55 and 55' shown in FIG. 1 would serve to control such gases if so desired.

Thirdly, while substrate 48 is shown as a planar sheet in these examples, it can be seen that substrates of any convenient size and shape may be used and that instead of a continuous substrate transport 46, other substrate supports well known to the art, such as planetary rotating substrate supports may be used.

Fourth, the horizontal aspect presented in these examples is not necessary except in cases requiring use of the molten material crucibles. Vapor sources can be configured to supply vapor in any orientation. Rotating cathodes can operate in any orientation.

Fifth, the apparatus and methods shown in this invention are suitable for reactive sputtering if desired.

Sixth, a molten material crucible might apply molten material directly to the primary cathode.

Thus the scope of the invention should be determined by the appended claims and their legal equivalents rather than by the examples given.

I claim:

1. In apparatus for sputtering a compound thin film of selected coating materials onto selected substrates, an evacuable coating chamber, a thermally cooled rotating primary magnetron surrogate sputtering cathode, a plurality of controllable auxiliary coating means, said auxiliary coating means for coating the surface of said primary cathode with a plurality of selected materials, wherein said controllable auxiliary coating means cooperate to deposit upon said primary surrogate cathode a multi-element coating containing all necessary elements in controlled amounts, said multi-element coating being rotatable into a sputter plasma zone of said primary cathode which sputter deposits said selected compound thin film onto said substrates.

2. The apparatus of claim 1, including means for cyclically varying the sputter power to said primary surrogate cathode in a manner to improve uniformity of chemical composition of said deposited compound thin film.

3. The apparatus of claim 1, including use of an electron injection means for injecting electrons into a selected portion of said sputter plasma zone for the purpose of improving deposited film uniformity.

4. The apparatus of claim 1, wherein said means for coating the surface of said rotating primary surrogate cathode with material to be carried into a sputter deposition zone includes a plurality of heated, temperature controlled vapor sources, each of said vapor sources emitting selected material vapors through a pattern of multiple apertures into a vapor duct, said ducts being joined in a plenum chamber closely spaced to said cathode surface, said plenum providing substantial mixing of said vapors as they condense upon said surrogate rotating cathode surface in a single uniform coating layer of controlled thickness.

5. The apparatus of claim 1, wherein said means for coating the surface of said rotating primary surrogate cathode includes a plurality of heated temperature controlled vapor sources, each of said sources filled with selected material emitting vapors through a pattern of multiple apertures into an exhaust manifold, said vapor source manifolds being closely spaced to said cathode surface, causing said vapors to condense upon said surrogate rotating cathode surface in a multilayer configuration with separately controlled thicknesses of each of said layers.

6. The apparatus of claim 1, wherein said means for coating the surface of said rotating primary surrogate cathode includes rotating auxiliary magnetron surrogate sputtering cathodes which are coated by means of a selected combination of heated temperature controlled vapor sources, said sources being filled with selected material emitting vapors through a pattern of multiple apertures into an exhaust duct, said vapor source ducts being closely spaced to said cathode surface, causing said vapors to condense upon said auxiliary surrogate rotating cathode surfaces in a controlled thickness.

7. The apparatus of claim 1, wherein said means for coating the surface of said rotating primary surrogate cathode, while in an evacuable coating chamber, includes a selected combination of rotating auxiliary magnetron surrogate sputtering cathodes which are coated by means of heated molten metal crucibles having roller transport means for placing controlled amounts of a molten material upon said auxiliary cathode surface of such thickness as to provide sufficient material for at least one rotation of said auxiliary cathode while being thin enough so as to not drip when molten, thus allowing substantially higher sputtering power to be applied to said auxiliary cathode.

8. The apparatus of claim 1, wherein said means for coating the surface of said rotating primary surrogate cathode surface, while in an evacuable coating chamber, includes a heated molten material crucible having roller transport means for placing controlled amounts of a molten material upon a primary rotating magnetron sputtering cathode surface of such thickness as to provide sufficient material for at least one rotation of said cathode while being thin enough so as not to drip when molten, thus allowing substantially higher sputtering power to be applied to said primary cathode.

9. The apparatus of claim 1, wherein said means for coating the surface of said rotating primary surrogate cathode, while in said evacuable coating chamber, includes a selected combination of rotating auxiliary cathode surfaces pre-coated prior to insertion into said evacuable chamber with material which, when sputtered in a controlled manner onto said primary rotating cathode, cooperates with other materials deposited onto said primary rotating surrogate cathode to deposit a thin film having a desired amount of said precoated material in said thin film.

10. The apparatus of claim 1, wherein said means for coating the surface of said rotating primary surrogate cathode includes a selected combination of rotating auxiliary cathode surfaces coated by means of molten material crucibles and vapor sources with materials which decompose into a solid and a gas during vaporization or when sputtered.

11. The apparatus of claim 1, including gas baffles which control gases emitted by said auxiliary coating means, said baffles optionally also serving to isolate the primary sputter zone from auxiliary sputter zones.

12. The apparatus of claim 1, including the separate thermal control of vapor sources and separate sputter power control of auxiliary magnetrons comprising said auxiliary coating means to accurately control elemental ratios in the final sputter deposited compound thin film.

13. The apparatus of claim 1, wherein the primary cathode is precoated with material which will cooperate with other surrogate cathodes comprising said auxiliary coating means to deposit a desired compound thin film.

14. A sputtering apparatus comprising a vapor source including a material container with lid and controlled heating means, a vapor duct connected to said material container by means of a pattern of selected apertures, said vapor ducts being terminated in a plenum region, said plenum region placed adjacent to a rotating magnetron sputtering cathode surface with a minimum gap consistent with rotation accuracy of said rotating magnetron cathode surface.

15. A sputtering apparatus comprising a molten material crucible including a molten material container with controlled heating means, with at least one roller to transfer molten material from said crucible to a rotating magnetron sputtering cathode surface in contact with said roller, with rotary means to synchronize rotation of said roller and said rotating cathode surface.

16. In apparatus for synthesizing chemical compounds in an evacuable coating chamber, a rotating primary surrogate magnetron cathode surface coated with precursor material by a selected combination of thermal vapor sources and by material sputtered from an auxiliary rotating surrogate magnetron, the surface of said auxiliary cathode having been coated by molten material roller coaters, wherein said rotating primary surrogate cathode carries said precursor material into an associated plasma sputtering zone wherein said precursor material is converted into said chemical compound.

17. In apparatus for synthesizing chemical compounds in an evacuable coating chamber, a rotating primary surrogate magnetron cathode surface coated with precursor material by a selected combination of thermal vapor sources and by material sputtered from an auxiliary rotating surrogate magnetron, the surface of said auxiliary cathode having been pre-coated with a selected material prior to insertion into said evacuable coating chamber, wherein said rotating primary surrogate cathode carries said precursor material into an associated plasma sputtering zone wherein said precursor material is converted into said chemical compound.

18. A method for sputtering a compound thin film of selected coating materials onto selected substrates, comprising providing an evacuable coating chamber containing a thermally cooled rotating primary magnetron surrogate cathode, a plurality of controllable auxiliary coating means for coating the surface of said primary cathode with a plurality of selected materials, and causing said controllable auxiliary coating means to cooperate to deposit upon the surface of said primary surrogate cathode a multi-material coating containing all the necessary materials in controlled amounts, wherein said multi-material coating on the surface of said primary surrogate cathode is rotated into a sputter plasma zone of said primary cathode, causing the selected compound thin film to be deposited on at least one substrate.

19. The method of claim 18, including cyclically varying the sputter power to said primary surrogate cathode in a manner so as to improve the uniformity of the chemical composition of the deposited compound thin film.

* * * * *